(12) United States Patent
Konsek et al.

(10) Patent No.: US 9,595,649 B2
(45) Date of Patent: Mar. 14, 2017

(54) NANOSTRUCTURED LED

(71) Applicant: GLO AB, Lund (SE)

(72) Inventors: Steven Konsek, Malmo (SE); Jonas Ohlsson, Malmo (SE); Yourii Martynov, Geldrop (NL); Peter Jesper Hanberg, Soborg (DK)

(73) Assignee: GLO AB, Lund (SE)

( * ) Notice: Subject to any disclaimer, the term of this patent is extended or adjusted under 35 U.S.C. 154(b) by 0 days.

(21) Appl. No.: 14/168,757

(22) Filed: Jan. 30, 2014

(65) Prior Publication Data

US 2014/0239327 A1    Aug. 28, 2014

Related U.S. Application Data

(63) Continuation of application No. 13/002,906, filed as application No. PCT/SE2009/050878 on Jul. 7, 2009, now Pat. No. 8,669,574.

(30) Foreign Application Priority Data

Jul. 7, 2008  (SE) ........................................ 0801621

(51) Int. Cl.
*H01L 33/00* (2010.01)
*H01L 33/62* (2010.01)
(Continued)

(52) U.S. Cl.
CPC .............. *H01L 33/62* (2013.01); *B82Y 20/00* (2013.01); *F21S 48/115* (2013.01); *H01L 33/08* (2013.01);
(Continued)

(58) Field of Classification Search
CPC ......... H01L 33/62; H01L 33/60; H01L 33/24; H01L 33/38; H01L 21/02603; H01L 33/20; H01L 33/08; H01L 29/0676; B82Y 20/00
(Continued)

(56) References Cited

U.S. PATENT DOCUMENTS 6,518,598 B1 * 2/2003 Chen ....................... H01L 33/38
257/690
6,784,463 B2   8/2004 Camras et al.
(Continued)

FOREIGN PATENT DOCUMENTS

CN   1881630 A      12/2006
JP   2001203386 A    7/2001
(Continued)

OTHER PUBLICATIONS

International Searching Authority—Swedish Patent Office (ISAISE). International Search Report, Intl. Application PCT/SE09/50878. Sep. 11, 2009.
(Continued)

*Primary Examiner* — Thao X Le
*Assistant Examiner* — Laura Dykes
(74) *Attorney, Agent, or Firm* — The Marbury Law Group PLLC

(57) ABSTRACT

The device according to the invention comprises a nanostructured LED with a first group of nanowires protruding from a first area of a substrate and a contacting means in a second area of the substrate. Each nanowire of the first group of nanowires comprises a p-i-n-junction and a top portion of each nanowire or at least one selection of nanowires is covered with a light reflecting contact layer. The contacting means of the second area is in electrical contact with the bottom of the nanowires, the light-reflecting contact layer
(Continued)

being in electrical contact with the contacting means of the second area via the p-i-n-junction. Thus when a voltage is applied between the contacting means of the second area and the light-reflecting contact layer, light is generated within the nanowire. On top of the light-reflecting contact layer, a first group of contact pads for flip-chip bonding can be provided, distributed and separated to equalize the voltage across the layer to reduce the average serial resistance.

18 Claims, 7 Drawing Sheets

(51) Int. Cl.
    *B82Y 20/00* (2011.01)
    *H01L 33/08* (2010.01)
    *H01L 33/60* (2010.01)
    *H01L 33/24* (2010.01)
    *H01L 27/15* (2006.01)
    *H01L 33/20* (2010.01)
    *H01L 33/32* (2010.01)
    *H01L 33/38* (2010.01)
    *H01L 33/40* (2010.01)
    *H01L 33/18* (2010.01)
    *F21S 8/10* (2006.01)

(52) U.S. Cl.
    CPC ............. *H01L 33/24* (2013.01); *H01L 33/60* (2013.01); *F21S 48/1747* (2013.01); *F21Y 2105/10* (2016.08); *F21Y 2115/10* (2016.08); *H01L 27/153* (2013.01); *H01L 27/156* (2013.01); *H01L 33/18* (2013.01); *H01L 33/20* (2013.01); *H01L 33/32* (2013.01); *H01L 33/38* (2013.01); *H01L 33/40* (2013.01); *H01L 2924/0002* (2013.01); *Y10S 977/762* (2013.01); *Y10S 977/95* (2013.01)

(58) Field of Classification Search
    USPC .............................................. 257/98; 977/76
    See application file for complete search history.

(56) References Cited

U.S. PATENT DOCUMENTS

| 7,265,037 | B2 | 9/2007 | Yang et al. |
| 7,521,274 | B2 | 4/2009 | Hersee et al. |
| 2002/0093023 | A1 | 7/2002 | Camras et al. |
| 2002/0171087 | A1 | 11/2002 | Krames et al. |
| 2004/0000862 | A1* | 1/2004 | Setlur et al. ................... 313/501 |
| 2004/0061123 | A1 | 4/2004 | Shelton et al. |
| 2004/0109666 | A1 | 6/2004 | Kim, II |
| 2005/0006754 | A1 | 1/2005 | Arik et al. |
| 2006/0192223 | A1* | 8/2006 | Lee et al. ......................... 257/99 |
| 2006/0197436 | A1 | 9/2006 | Conley, Jr. et al. |
| 2006/0223211 | A1 | 10/2006 | Mishra et al. |
| 2006/0292839 | A1 | 12/2006 | Yi et al. |
| 2007/0020950 | A1* | 1/2007 | Choi et al. .................... 438/775 |
| 2007/0228393 | A1* | 10/2007 | Yoneda ................... H01L 33/22 257/79 |
| 2008/0036038 | A1 | 2/2008 | Hersee et al. |
| 2008/0157057 | A1 | 7/2008 | Kim |
| 2008/0210956 | A1 | 9/2008 | Kim |
| 2010/0193033 | A1 | 8/2010 | Uetani |

FOREIGN PATENT DOCUMENTS

| JP | 2004193527 A | 7/2004 |
| JP | 2006332650 A | 12/2006 |
| WO | WO 01/47036 A1 | 6/2001 |
| WO | WO 2008/048704 | 4/2008 |

OTHER PUBLICATIONS

SIPO, P.R. China First Office Action of Chinese Patent Application No. 201210569542.1 dated Nov. 21, 2014.
European Office Communication for EP Application No. 09 803 213.9-1551, dated Jan. 18, 2016, (5 pages).

* cited by examiner

NANOSTRUCTURED LED

TECHNICAL FIELD OF THE INVENTION

The present invention relates to LEDs. In particular the invention relates to nanostructured LEDs.

BACKGROUND OF THE INVENTION

Nanowire based LEDs (Light Emitting Diodes) are comprised of semiconductor nanowires or arrays of semiconductor nanowires grown on a substrate, like for example silicon or GaN. Typically on such substrate a planar buffer layer is grown first and subsequently an array of nanowires is grown on the surface of the buffer layer. The buffer layer is used as the base layer for growing the nanowires. Additionally, it can serve for electrical current transport. The buffer layer is usually transparent for the light emitted by the LED.

Each nanowire protrudes from the buffer layer and contains multiple regions of materials forming p-i-njunctions around the nanowire core or along the nanowire axis. When charge carriers are injected into the respective p- and n-regions, they recombine in the i-region, and this recombination generates light. The light is generated inside each nanowire randomly and emitted in all directions. One problem with such a structure is that a substantial fraction of the generated light is wasted, as only a portion is directed in a desired direction.

Another problem associated with nanowire based LEDs is that this structure relies on the conductivity of the buffer layer for current transport into the active region, the p-i-n-junction. For large devices the distance between the contact and the nanowires within the LED can be considerable, causing voltage drop and resistive losses over the buffer layer. Carrier recombination and light generation will happen predominantly near the contact pad on the n-contact side causing current crowding and non-uniform luminance. This problem remains when mounting the LED device onto a carrier supplying the LED device with current for light generation.

The difference between a pn-junction and a p-i-n-junction is that the latter has a wider active region. The wider active region allows for a higher probability of recombination in the i-region, thus generation of light, although both pn- and p-i-n-junctions can be used for light generation in LED devices.

SUMMARY OF THE INVENTION

The prior art has drawbacks with regard to being able to provide a nanostructured LED having high efficiency and being suitable for large scale production.

The object of the present invention is to overcome at least some of the drawbacks of the prior art. This is achieved by devices as defined in claim 1.

A device according to the invention comprises a nanostructured LED with at least one nanowire and contacting means. Each nanowire protrudes from a buffer layer on a substrate and comprises a pn- or p-i-n-junction and a top portion of each nanowire or at least one selection of nanowires is covered with a light-reflecting or transparent contact layer. The contacting means is in electrical contact with the bottom portion of each nanowire, the light-reflecting or transparent contact layer being in electrical contact with the contacting means via the pn- or p-i-n-junction. Thus when a voltage is applied between the contacting means and the light-reflecting or transparent contact layer, light is generated in the active region in the nanowire. On top of the buffer layer, a first group of contact pads for flip-chip bonding are distributed and separated to reduce the average series resistance.

Such a nanostructured LED can be placed on a carrier having contact pads corresponding to the position of p-contact pads and n-contact pads on the nanowire LED chip and attached using soldering, ultrasonic welding, bonding or by the use of electrically conductive glue. The contact pads on the carrier can be electrically connected to the appropriate power supply lead of the LED package.

One object of the invention is to overcome problems related to flip-chip bonded LED's, namely to increase efficiency, and decrease losses related to series resistance in the buffer layer. It is further an advantage of the invention to exhibit low energy consumption.

One further object of the invention is to provide a nanowire LED comprising one or more contact groups of nanowires that can be exclusively and individually addressed.

Embodiments of the invention are defined in the dependent claims. Other objects, advantages and novel features of the invention will become apparent from the following detailed description of examples of embodiments of the invention when considered in conjunction with the accompanying drawings and claims.

BRIEF DESCRIPTION OF THE DRAWINGS

Preferred embodiments of the invention will now be described with reference to the accompanying drawings, wherein.

DETAILED DESCRIPTION OF EMBODIMENTS

The embodiments to be described in the following are all based on nanostructured LED/LED's, and a prior art version of such can be found in WO2008048704.

In the following discussion the term nanostructure or nanoelement is intended to mean a structure having at least two dimensions not greater than about 1 µm.

Figure 1:
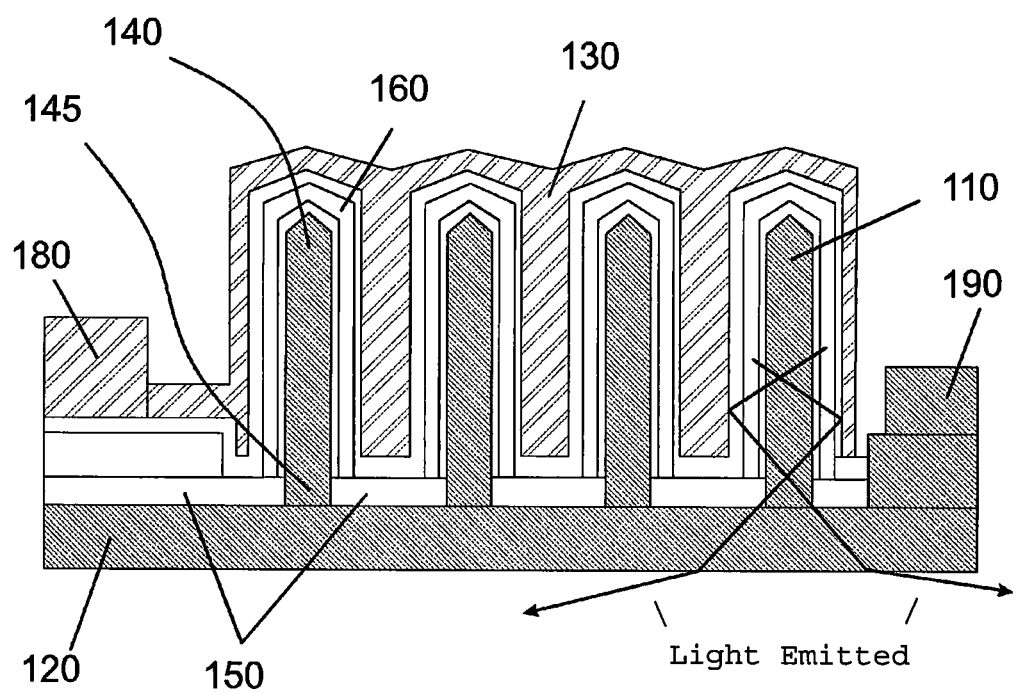
FIG. 1 shows a schematic structure of a nanowire LED FIG. 2a) shows the nanowire LED with a bottom contact and a top contact that strictly defines the active area of the LED, and b) shows the nanowire LED with two active areas, that can be addressed exclusively and individually

In one embodiment, FIG. 1, of a nanostructured LED according to the invention, the nanowires 110 protrude from a substrate or a buffer layer 120 deposited on a substrate (the substrate not shown in the figure), where the substrate or buffer layer 120 can be Si, Ge, Al$_2$O$_3$, SiC, Quartz, glass, GaN or any other material suitable for nanowire growth and further processing. The buffer layer 120 can be made of a material different than the substrate material. The buffer layer 120 is usually chosen so as to match the desired nanowire material, and thus form a growth base for the nanowires later in the process. That means that the buffer layer 120 is chosen so that the lattice parameters of the nanowires and the buffer layer admit nanowire growth. The growth of nanowires can be achieved by utilizing methods described in the above referred application, in which well known mask 150 techniques result in nanowires with a pn- or p-i-n-junction 160. The nanowires can be of any semiconductor material, although III-V semiconductors such as GaN, InP, GaAs, AlInGaN, AlGaN and InGaN etc. are expedient for the production of LEDs. In some designated areas, the nanowires are then eliminated by etching down to the buffer layer 120 resulting in a first area where the nanowires protrude from the substrate, and a second area, free from nanowires, and in electrical contact with the bottom portion 145 of the nanowires in the first area. In the second area, a metal or highly doped semiconductor is arranged to form the contacting means. In the following, the wording junction is intended to include both pn- and p-i-n-junctions unless otherwise indicated.

Thus, in principal, the substrate is covered with nanowires except at the location of the first group of contact pads 190 contacting the buffer layer or substrate, where the nanowires have been removed. According to the invention, a second group of contact pad(s) 180 and light-reflecting or transparent contact layer 130 is defined on the nanowires 110 according to FIG. 2a, and thus strictly defines the light emitting active area of the LED device. All nanowires 110 located outside the area defined by the second group of contact pad(s) 180 and the light-reflecting or transparent layer 130 will be electrically dead, and will not contribute to the formation of light upon an applied voltage between the first group of contact pad(s) 190 and the second group of contact pad(s) 180. There is no current leakage to nanowires located outside the active area. Thus, the nanowire technology offers a unique ability to allow strict definition of active areas by the second group of contact pads, which is not possible in planar technology.

Figure 2:
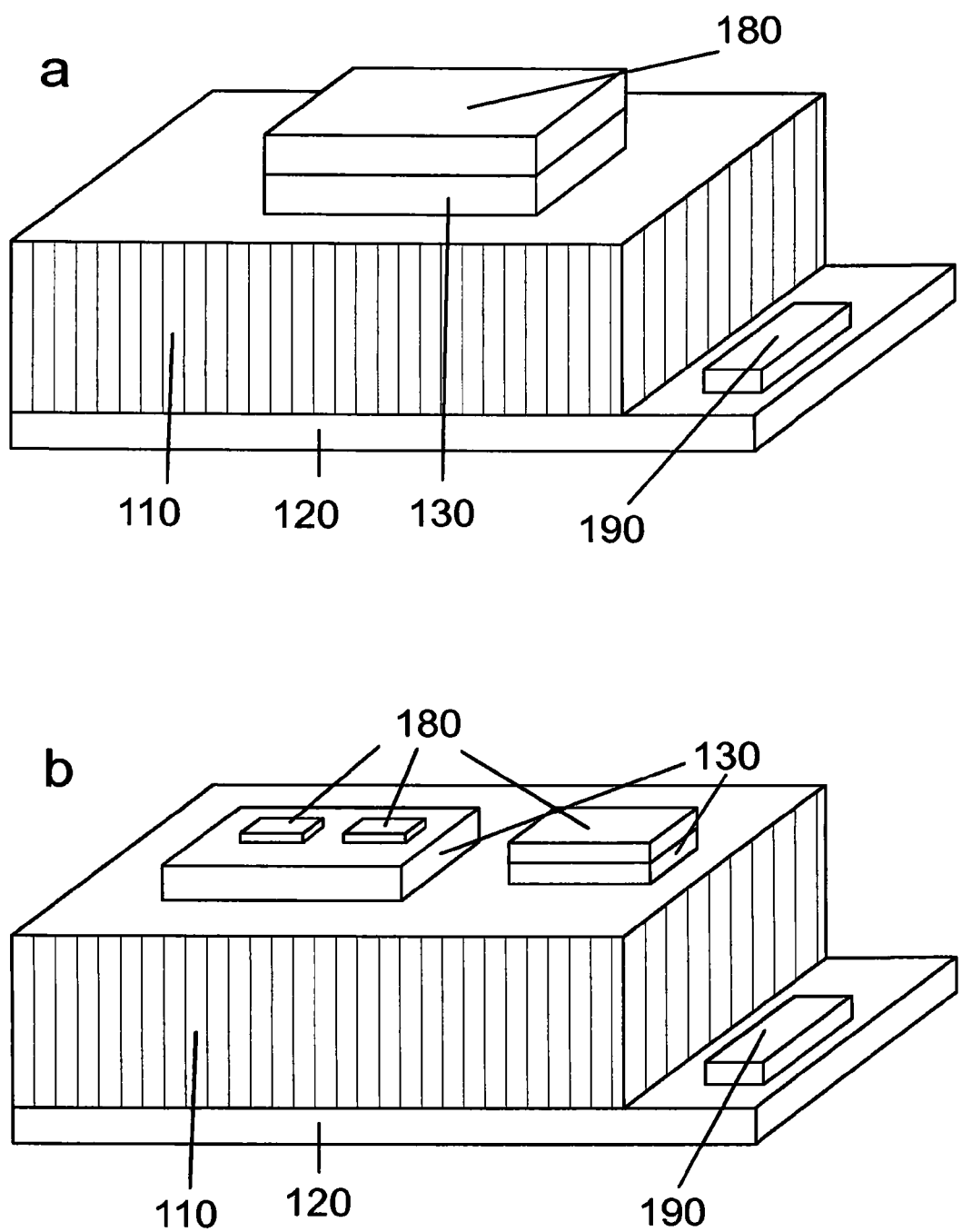

FIG. 2b illustrates an embodiment of the present invention where there are two contact pads of the second group of contact pad(s) 180. As described above, only the nanowires 110 located under the second group of contact pad(s) 180 and the light reflecting or transparent layer 130 will be active in the generation of light when a voltage is applied. The distribution of the, in FIG. 2b two contacts, on top of the nanowires, makes it possible to exclusively and individually control the two contact groups of nanowires defined by the second group of contact pad(s) 180 and the light reflecting or transparent layer 130. Since there is no leakage to nanowires beside the active areas, the resolution of the active areas is strictly determined by the resolution of the contact pattern. Thus, a substrate having a multitude of contact groups of nanowires, where all the contact groups of nanowires can be exclusively and individually addressed can be used to form for example displays, Red-Green-Blue-LED setups (RGB), dimmers, head-lights for vehicles, etc.

Figure 3:
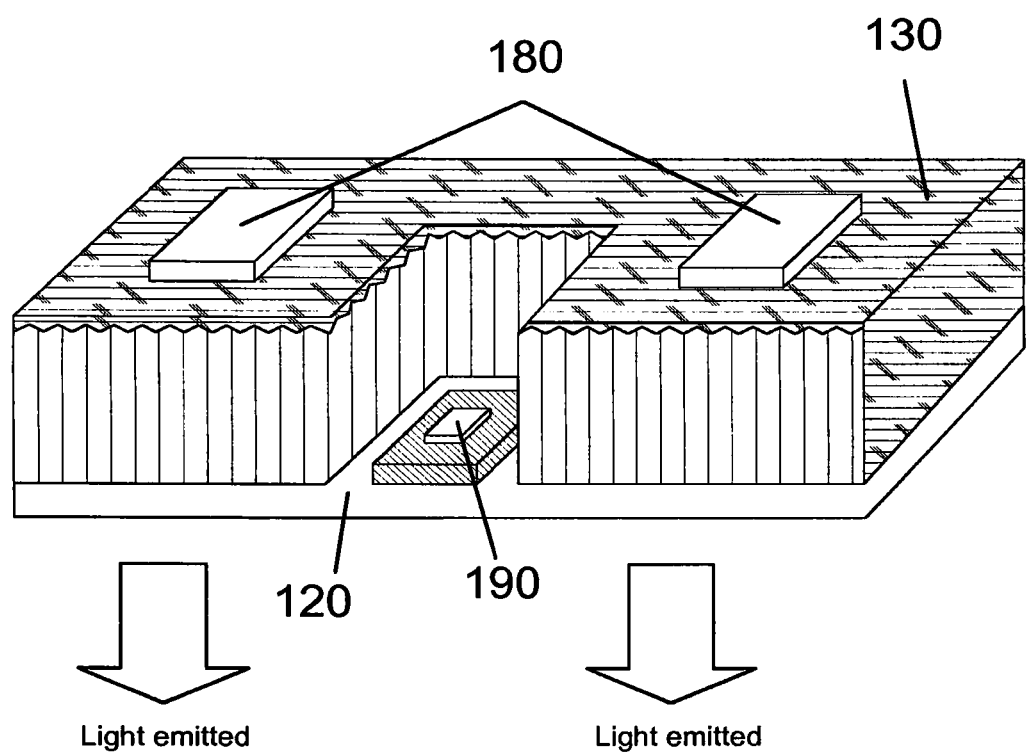
FIG. 3 illustrates a nanowire LED with a top contact and a bottom contact

Referring to FIG. 3 it can be seen that a metallic reflector forming a light-reflecting contact layer 130, or mirror layer, is formed on the top portion 140 of the protruding nanowires in the first area. The light-reflecting contact layer 130 can be formed in several ways, although using a PVD (Physical Vapour Deposition) method and well-known mask techniques is the preferred method. The reflector is preferably made of aluminum or silver, but other metals or metal alloys may also be used. The purpose of the light-reflecting contact layer 130 is to prevent light from leaving the structure in a direction other than the preferred direction, and to focus the emitted light to one single direction. Additionally, the light-reflecting contact layer 130 also usually functions as a top contact to the nanowires.

Nanowire based LEDs are either front-emitting or back-emitting, i.e. the light generated within the nanowires are emitted from the top of the nanowires, or through the bottom of the nanowires, the buffer layer and the substrate, respectively. Nanowire-based LED devices as such, are usually mounted on a carrier that provides mechanical support and electrical connections. The carrier should not absorb light or limit the light emission from the device. One way to construct a LED with improved efficiency is to make a flip-chip device. A metallic layer with high reflectivity in the visible region of the light spectra is formed on top of the nanowires. The substrate, on which the nanowires have been grown, is removed as a part of the process, leaving the buffer layer 120, to allow for the light to be emitted through said buffer layer 120 which has formed a base for the nanowires. Emitted light directed towards the top of the nanowires is then reflected when it encounters the metallic layer, thus creating a clearly dominating direction for the light leaving the structure as shown in FIG. 3. This way of producing the structure allows for a much larger fraction of the emitted light to be guided in a desired direction, increasing the efficiency of the LED.

Figure 6:
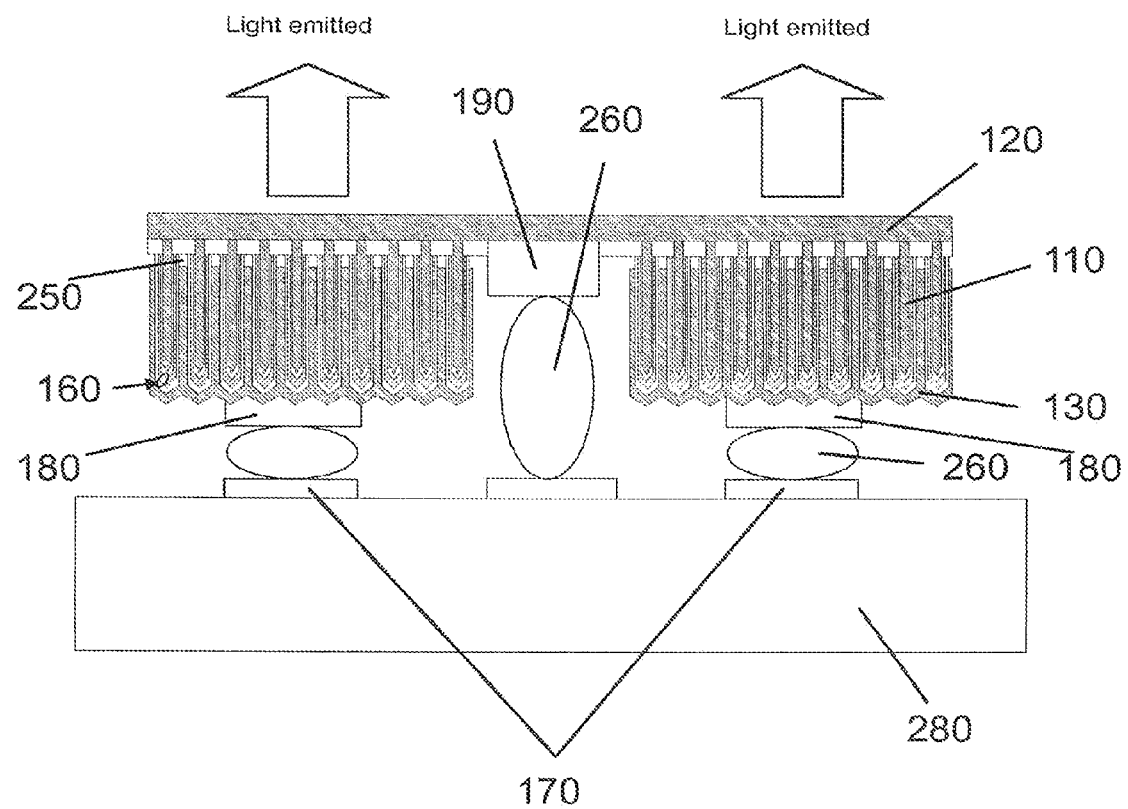
FIG. 6 shows the nanowire structure bonded onto a carrier with the contact bumps between the p- and n-contacts

To be able to attach the structure to a carrier wafer 280 (FIG. 6) or a micro electronic structure, contact pads have to be formed on the buffer layer 120, also called the bottom layer, and on the light-reflecting contact layer 130, called the top layer. A first way of doing this is to form one contact on the buffer layer and one contact on the mirror layer, letting the layer itself distribute the current to the nanowires. This will make it impossible to address a nanowire or group of nanowires independently of the rest of the nanowires or groups of nanowires, since at least one the contact pads of one contact layer needs to be distributed to enable individual addressing of groups of nanowires. In addition, one single contact for each contact layer will give rise to losses such as, for instance, resistive losses since the conduction distance in the layer can be relatively long. A second preferred way of forming the contacts is to form several contact pads and distribute them over the buffer layer 120 surface, for example by creating a layer of interleaving arrays of contact pads, to equalize the current density on the surface. This improves the efficiency of the LED device by decreasing resistive losses originating from series resistance in the buffer layer. The effect resistive losses become more and more dominant as the resistivity of the layer increases. In the case of a metal layer having low resistivity, the gain is small, but for a layer having higher resistivity such as a semiconductor buffer layer, the gain can be significant. The first group of contact pads 190 on the buffer layer may be called the cathode, and the second group of contact pads 180 on top of the light-reflecting contact layer may be called the anode.

A contact group of nanowires comprises at least one nanowire, but preferably each contact group comprises a plurality of nanowires. Having a plurality of nanowires in a group of nanowires increases reliability of the device, since the group of nanowires in that case does not strongly depend upon the functionality of one single nanowire. However, the term group in this text is defined so as to include the case where a contact group of nanowires comprises the case with only one nanowire.

The method of using distributed contact pads is also applicable on the second area on top of the light-reflecting contact layer 130. This layer is very often a metallic layer, but it can also be built up of compound material having high optical reflectivity and relatively high electrical conductivity. The distributed contact pads will, if the light-reflecting contact layer 130 is properly adapted, enable exclusive and individual addressing of at least one group of nanowires. Another essential advantage of using distributed contact pads even in the case of a metallic light-reflecting contact layer 130 is that an increased number of contact points offer an improved structural support in the case where the structure is bonded onto a carrier wafer 280.

For the first group of contact pads 190 the distribution can be done in many different ways, and in many geometric configurations, utilizing in principle any pattern, as long as the contact pads do not short-circuit the top layer and the bottom layer. An advantage of the distributed contact pads is that they can equalize the current distribution to the layer where they are applied, which can also be achieved with the distributed contact pads in an irregular pattern. Thus, the geometric arrangement for the contact pads is not critical, as long as the current distribution effect is achieved.

In one embodiment of the present invention, the contact pattern for the contact pads is formed using a plurality of arrays for the top layer and the bottom layer respectively, and simply letting the arrays of contact pads for the top layer and the bottom layer be laterally displaced in relation to each other. The contact pads for the bottom layer can all be connected through for example the buffer layer, and thus be distributed between nanowires or groups of nanowires, as long as this contact layer is not used for individual addressing. The contact pads for the top layer are also distributed, but not at all connected to each other through the light-reflecting contact layer 130 as shown in FIGS. 7 and 8, when this contact layer is used for individual addressing.

Figure 4:
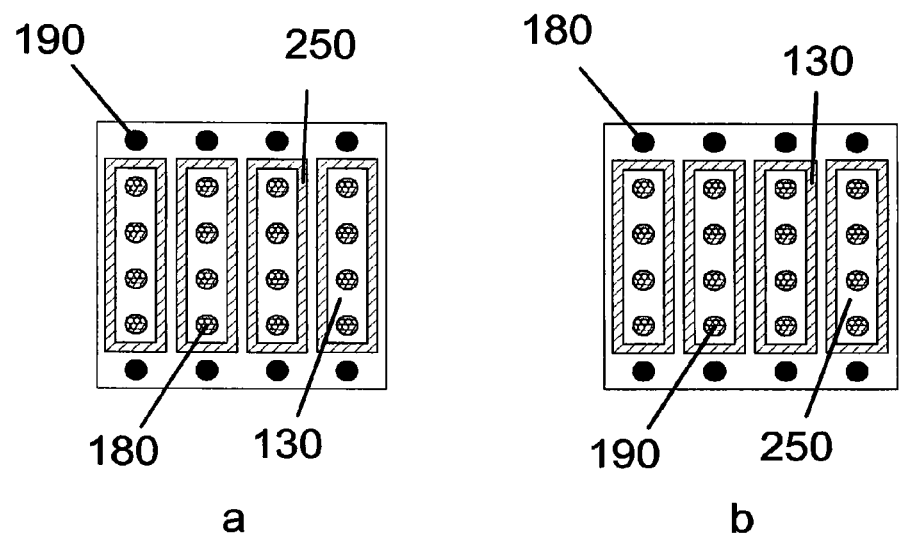
FIG. 4 is a suggestion with several individual contacts on how to design the contact pattern on a nanowire LED
Figure 5:
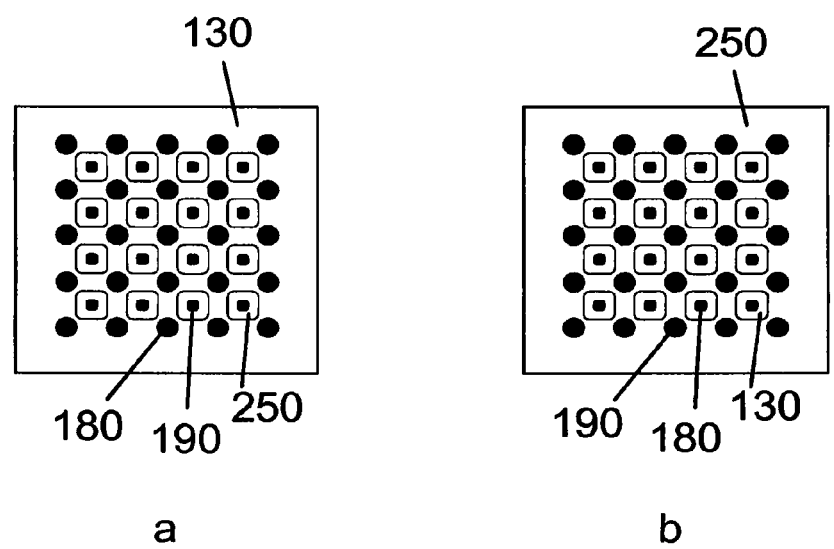
FIG. 5 is another suggestion with several individual contacts on how to design the contact pattern on a nanowire LED

In another embodiment, the first group of contact pads 190 and the second group of contact pads 180 for the top layer and the bottom layer are formed as arrays perpendicular to each other seen in FIG. 4. An electrically insulating portion 250 that can be electrically insulating material or just absence of conducting material is separating the groups as seen in the design in FIGS. 4 and 5. In FIG. 5, the contact pads are formed in a matrix pattern with a quadratic or rectangular shape for the first and the second area, and then laterally displaced in relation to each other. Also combinations of the geometrical contact pad setups are possible. The design in FIGS. 4 and 5 and combinations thereof show just a few possible ways to form the conduction pattern of the device, but there are of course an infinite number of possible solutions.

The contact pads can also act as soldering bumps 260 (FIGS. 6 and 8) in the bonding process if the LED structure is attached to another wafer by soldering. If type of material in the contact pad and wafer are chosen appropriately, the two units can be thermally bonded to each other. Another way is to mount soldering bumps onto the contact pads before bonding. A flip-chip LED device bonded onto a carrier wafer using soldering bumps can be seen in FIGS. 6 and 8. The shape on the soldering bumps is not in any way intended to show the shape in a real situation, but formed as such to ease the understanding of the figure.

Figure 7:
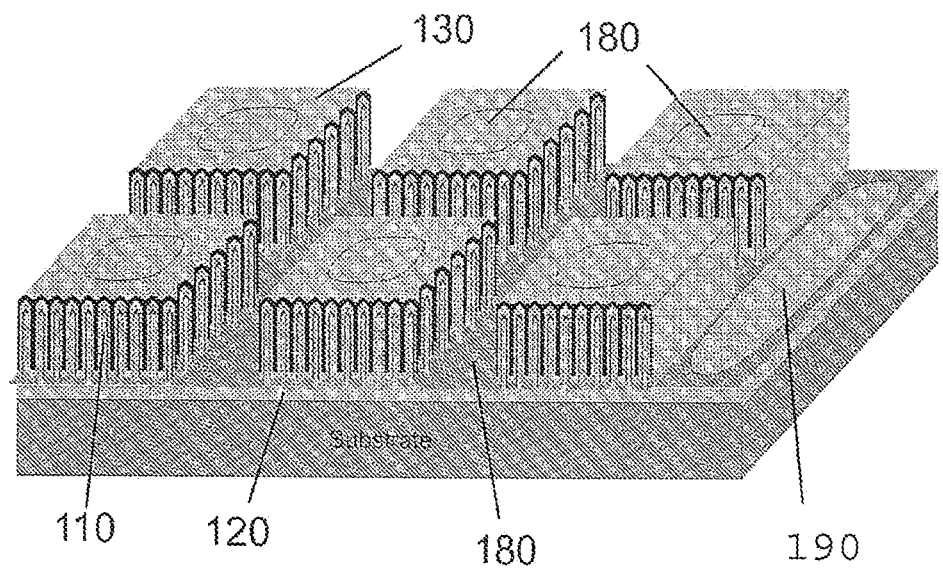
FIG. 7 shows a LED device with areas between the contact groups of nanowires where the nanowires have been removed that works as cooling flanges
Figure 8:
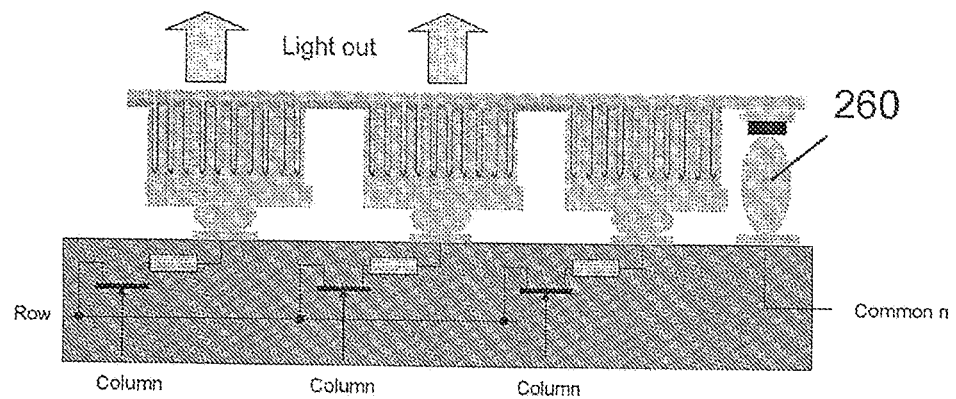
FIG. 8 shows a flip-chip LED mounted on a carrier with control electronics
Figure 9:
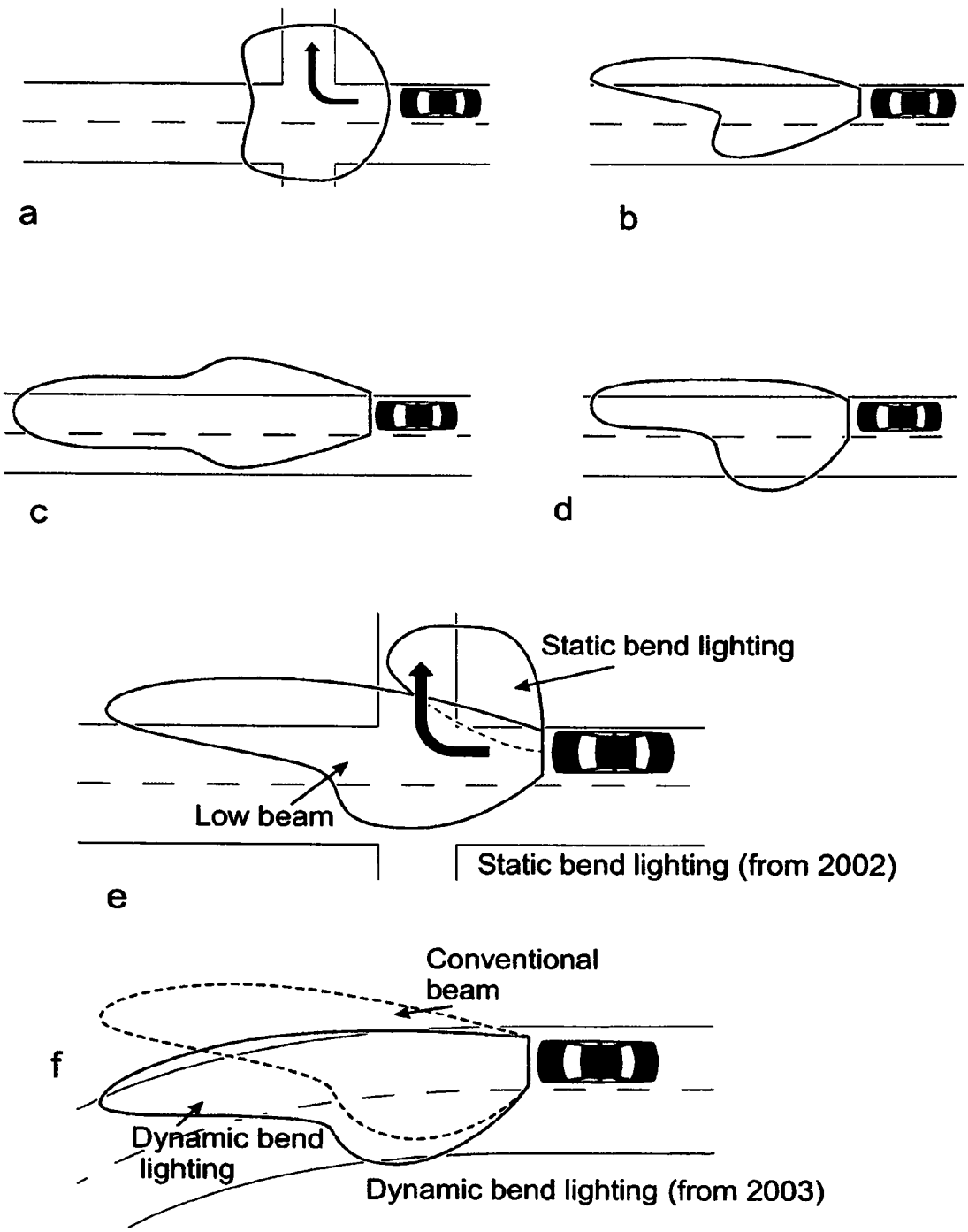
FIG. 9 shows how a LED device can be used as a smart head-light in a vehicle

In one embodiment of the present invention according to FIG. 7, the nanowires have one common contact, for example the buffer layer, for the first group of contact pads 190. The second group of contact pads 180 and the light-reflecting contact layer 130 is distributed and electrically separated, such that groups of nanowires can be addressed exclusively and individually, independently of the other groups of nanowires, such that a group of nanowires represents for example one pixel. This enables having an arrangement where different groups of nanowires have different properties, for example different groups can be adapted to represent a colour in a Red-Green-Blue (RGB) setup. In the figure (FIG. 7), the contact groups of nanowires are separated by an etched trench. However, this is not necessary in the case of distributed contacts for nanowires. The electrically dead area between the contact groups of nanowires can also be nanowires that are not active, since the active area, that is, the active contact group of nanowires, is strictly defined by the light-reflecting contact layer and the contact pads, and each active group of nanowires can be individually addressed. This is not the case in planar technology fabrication of LEDs, where leakage currents etc. will destroy the individuality of LEDs.

Letting the individual contact areas represent different colours in an RGB setup can be done in several ways. A group of nanowires can be adapted to respond differently to different voltage levels, such that a first voltage level represents red light, a second voltage level represents green light, and a third voltage level represents blue light. Accordingly, the contact groups of nanowires can be controlled to emit light of a desired wavelength, thus a desired colour. Another possible solution is to let different contact groups of nanowires comprise nanowires with different material composition, and thus nanowires of different groups respond differently to the same voltage level. In the same manner, a contact group of nanowires can be adapted to respond to an applied voltage such that an increased voltage results in an increased intensity, thus higher voltage results in a stronger emission of that particular group of nanowires. In that way, the intensity of the coloured emission, for example RGB, can be controlled colour by colour.

In another embodiment, a multitude of groups of nanowires are arranged on a substrate, where it is possible to address every group exclusively and individually. The groups of nanowires can all have the same properties when a voltage is applied, here called an active group, although the number of active groups can be varied depending on the amount of light desired. This can be very useful, for example when using LEDs as the headlight in vehicles (for example cars, trucks, transport lorry's etc.). The amount of light (high-beam or low beam) can be controlled by the number of active groups of nanowires. That is, the more active groups means more emitted light. In addition, different groups of nanowires can be attributed to different lighting modes, for example one mode for highway driving, one mode for country driving, and one mode for adverse weather driving etc., as illustrated in FIG. 8.

One way to fabricate such a device is to grow an array or arrays of nanowires on top of an n-doped GaN buffer on a substrate. The nanowires are arranged as a uniform array or a set of sub-arrays with gaps, each sub-array corresponding to an individual pixel. The nanowires consist of an n-doped GaN core, an active radial InGaN layer and a p-doped shell. During post processing the nanowires are first coated with a metal stack that forms p-contact to the shell, metallic reflector and metal bond pads. The metal layers are patterned to form the individual pixels of the device. These pixels are electrically isolated from each other. Subsequently a common n-contact to the buffer is formed in the area outside the active area of the display. There the nanowires are locally removed e.g. by etching and the underlying insulating mask layer is removed to expose the GaN buffer layer. The n-contacts are applied to it and contact pads are formed. The nanowire LED die made on the substrate is placed on a sub-mount wafer having contact pads corresponding to the positions of p- and n-contact pads on the nanowire LED die made on the substrate, and attached using soldering or ultrasonic welding. The sub-mount wafer can also contain an active transistor current source matrix for driving the LED pixels. Then, the material of the original substrate is removed by grinding, etching, lapping, or a combination of these methods. Finally, a layer of colour converting phosphor can be applied on the surface where the light exits the structure, to produce white light from for example blue light emission.

In another embodiment of the invention, the light-reflecting contact layer 130 on top of the nanowires is aluminum or silver. Silver, among the metals, has the best reflection coefficient in the visible region of the optical spectra, but is more prone to exhibit corrosion damage in normal atmosphere if not capped inside a structure. $Si_3N_4$, $SiO_2$, $Al_2O_3$ or any other stable dielectric can be used as a capping layer. After deposition the capping layer is preferably patterned to allow exclusive and individual electrical contact to the mirror layer of individual nanowires or groups of nanowires. Aluminum is another good option. It has a reflective index in the visible region somewhat lower than silver, but exhibits very good corrosion resistance in dry atmospheric environments. In order to improve device reliability additional dielectric capping as described above may still be desired. Possible other solutions are non-metallic high reflectivity materials that actually can reach higher reflectivity coefficients than silver in specific wavelength intervals when for example integrated into engineered Bragg reflector stacks. These include dielectric multi layers from compounds such as $SiO_2$, $Si_3N_4$, and $Al_2O_3$. Such dielectric mirrors are electrically non-conductive. Therefore they should be combined with transparent conductive materials like Indium Tin Oxide (ITO) deposited onto the nanowires prior to the multilayer dielectric mirrors. Multilayer dielectric mirror must then be patterned to allow electrical connection to the transparent conductor and thus to the device.

In another embodiment of the present invention, the light-reflecting contact layer 130 is deposited on top of the nanostructured LED such that the light-reflecting contact layer 130 extends down the sidewalls of the peripheral nanowires for at least one group of nanowires of the first area. This further improves the efficiency of the nanostructured LED, since with this arrangement there is only one direction for the generated light to leave the structure, and this is the direction preferred and defined by the user. In all other directions the light will be reflected until it exits through the only open exit.

In another embodiment of the present invention, the nanostructured LED is glued onto a new carrier wafer 280, using glue having high electrical conductivity. This is preferably done when the new carrier wafer 280 does not comprise a complex pattern of leads, but is merely a large contact area intended to supply power to the LEDs. Nevertheless, the gluing technique can also be used for more demanding applications with a more complex pattern of leads.

A carrier that acts as a new carrier wafer 280 can have different forms. It can be a new substrate for further processing. It can be a microelectronic structure, where the LED chip adds just another important feature to the complete device. The new wafer can also be a wafer that supplies only the electronic leads 170 to feed the LED structure when assembled together. Wafer in this sense is not intended to be limiting and comprise only semiconductor materials. It can also be e.g. a glass substrate or any other substrate offering sufficient structural support.

In another embodiment of the present invention, a nanostructured LED comprises at least one nanowire and a contacting means, wherein each nanowire protrudes from a substrate, each nanowire comprises a pn- or p-i-n-junction (160) and a top portion (140) of each nanowire is covered with a transparent contact layer. The contacting means is in electrical contact with the bottom portion (145) of each nanowire and the transparent contact layer is in electrical contact with the contacting means via the pn- or p-i-n-junction where the contacting means is a first group of contact pads (190) that are distributed and separated from each other.

In this embodiment, the transparent contact layer is also preferably distributed and arranged as contact pads such that every contact pad exclusively and individually connects electrically to one nanowire or one group of nanowires. In this way, this embodiment can be applied in the same manner as described earlier in the application, with the distinction that the light is emitted through the top portion of the nanowires, instead of being reflected in the top portion and being emitted through the bottom portion instead. Thus, in this embodiment the nanostructured LED does not need to be bonded to for example a carrier wafer.

It is to be understood by a person skilled in the art, that the p-contact and the n-contact can be used interchangeably, such that the p-contact is not restricted to be used as the top contact that contacts the top of the nanowires, and the n-contact is not restricted to be used as the contact that contacts the bottom part of the nanowires. While the invention has been described in connection with what is presently considered to be the most practical and preferred embodiments, it is to be understood that the invention is not to be limited to the disclosed embodiments On the contrary, is intended to cover various modifications and equivalent arrangements within the scope of the appended claims.

The invention claimed is:

1. A nanostructured LED comprising:
 a plurality of nanowires protruding from a substrate through openings in a mask layer, each nanowire comprising a pn- or p-i-n-junction that is formed between an n-doped core that comprises an n-doped III-V semiconductor material and protrudes upward vertically from a top surface of the substrate and a p-doped shell that laterally surrounds the n-doped core and overlies a top portion of the n-doped core and a respective proximal portion of the mask layer around a respective opening therein so that the pn or p-i-n junction includes a vertically extending portion that laterally surrounds the n-doped core and extends perpendicular to the top surface of the substrate,
 wherein a first group of multiple nanowires within the plurality of nanowires is covered with a laterally-extending portion of a continuous portion of a light-reflecting or transparent contact layer located within a respective area,
 wherein the continuous portion of the light-reflecting or transparent contact layer further includes vertical portions that extend downward from the laterally-extending portion between vertically extending portions of pn or p-i-n junctions of the first group of multiple nanowires and electrically contact outer sidewalls of p-doped shells of the first group of multiple nanowires, wherein a conductive material continuously extends along an interface between the light-emitting or transparent contact layer underneath the laterally-extending portion of the continuous portion of the light-reflecting or transparent contact layer, along and in contact with the sidewalls of the p-doped shells of the nanowires, and directly on the top surface of the mask layer, and wherein a second group of at least one nanowire within the plurality of nanowires is located outside of the at least one area of, and is not contacted by, any material of the light-reflecting or transparent contact layer and is electrically dead; and a first group of at least one contact pad that is in electrical contact with a bottom portion of each of the plurality of nanowires, wherein the light-reflecting or transparent contact layer is in electrical contact with the pn- or p-i-n-junctions.

2. The nanostructured LED according to claim 1, wherein the substrate comprises a buffer layer between a substrate material and the plurality of nanowires.

3. The nanostructured LED according to claim 1, wherein the light-reflecting or transparent contact layer defines a plurality of contact groups of nanowires that are laterally spaced apart.

4. The nanostructured LED according to claim 1, further comprising a second group of at least another contact pad in contact with a respective portion of the light-reflecting or transparent contact layer and distributed on top of a surface formed by the light-reflecting or transparent contact layer.

5. The nanostructured LED according to claim 4, wherein one or more contact pads in the second group of at least another contact pad is in individual contact with at least one contact group of nanowires such that the at least one contact group of nanowires can be addressed individually and independently of other groups of nanowires.

6. The nanostructured LED according to claim 4, further comprising a carrier structure which is bonded to the first group of at least one contact pad and second group of at least another contact pad.

7. The nanostructured LED according to claim 4, wherein the first group of multiple nanowires or the second group of at least one nanowire forms an array of nanowires.

8. The nanostructured LED according to claim 4, further comprising:
a carrier structure;
a first plurality of bumps electrically connecting the first group of at least one contact pad to the carrier structure; and
a second plurality of bumps electrically connecting a second group of at least another contact pad to the carrier structure.

9. The nanostructured LED according to claim 8, wherein:
the substrate comprises a light-transmissive buffer layer;
each of the plurality of nanowires protrudes from a first surface of the buffer layer;
the first group of at least one contact pad is located on the first surface of the buffer layer;
a phosphor is located over a second surface of the buffer layer;
the light-reflecting or transparent contact layer comprises a light-reflecting contact layer; and
the second group of at least another contact pad is located on the light-reflecting contact layer.

10. A nanostructured LED of claim 4, further comprising:
a first plurality of bumps electrically connecting the first group of at least one contact pad to a carrier structure; and
a second plurality of bumps electrically connecting the second group of at least another contact pad to the carrier structure.

11. The nanostructured LED according to claim 10, wherein:
the substrate comprises a light-transmissive buffer layer;
each of the plurality of nanowires protrudes from a first surface of the buffer layer;
the first group of at least one contact pad is located on the first surface of the buffer layer;
a phosphor is located over a second surface of the buffer layer; and
the second group of at least another contact pad is located on the light-reflecting or transparent contact layer.

12. The nanostructured LED according to claim 1, wherein the plurality of nanowires contains a plurality of contact groups of nanowires that can be addressed individually and independently of other contact groups of nanowires.

13. The nanostructured LED according to claim 2, wherein the first group of at least one contact pad comprises a plurality of contact pads that are connected through the buffer layer.

14. The nanostructured LED according to claim 1, wherein the plurality of nanowires and the first group of at least one contact pad are located on the same side of the substrate.

15. The nanostructured LED according to claim 1, wherein the light-reflecting or transparent contact layer comprises an aluminium or silver light-reflecting contact layer.

16. The nanostructured LED according to claim 1, wherein the light-reflecting or transparent contact layer comprises a $Zn_xO_{1-x}$ or $In_xSn_yO_{1-x-y}$ transparent contact layer.

17. The nanostructured LED according to claim 1, further comprising a carrier structure that is glued to the substrate.

18. The nanostructured LED according to claim 1, wherein:
each of the plurality of nanowires protrudes from a first surface of the substrate;
a phosphor is located over the plurality of nanowires protruding from the first surface of the substrate; and
the light-reflecting or transparent contact layer comprises a transparent contact layer.

* * * * *